United States Patent
Horie

(10) Patent No.: US 6,778,142 B2
(45) Date of Patent: Aug. 17, 2004

(54) ELECTRONIC DEVICE AND A CIRCUIT ARRANGEMENT

(75) Inventor: Kenichi Horie, Machida (JP)

(73) Assignee: Koninklijke Philips Electronics N.V., Eindhoven (NL)

(*) Notice: Subject to any disclaimer, the term of this patent is extended or adjusted under 35 U.S.C. 154(b) by 13 days.

(21) Appl. No.: 10/257,207

(22) PCT Filed: Feb. 15, 2002

(86) PCT No.: PCT/IB02/00477

§ 371 (c)(1),
(2), (4) Date: Oct. 9, 2002

(87) PCT Pub. No.: WO02/067639

PCT Pub. Date: Aug. 29, 2002

(65) Prior Publication Data

US 2003/0076660 A1 Apr. 24, 2003

(30) Foreign Application Priority Data

Feb. 16, 2001 (JP) .......................... 2001/40310

(51) Int. Cl.$^7$ ................................ H01G 1/36
(52) U.S. Cl. .................. 343/702; 455/83; 361/760
(58) Field of Search .......................... 343/702, 700 MS; 455/83, 270, 351; 361/760, 765; 333/202, 206

(56) References Cited

U.S. PATENT DOCUMENTS

| | | | | | |
|---|---|---|---|---|---|
| 4,590,614 | A | * | 5/1986 | Erat | 455/270 |
| 4,721,962 | A | * | 1/1988 | Gorzel | 343/702 |
| 5,511,238 | A | * | 4/1996 | Bayraktaroglu | 455/81 |
| 5,539,417 | A | * | 7/1996 | Terry et al. | 343/702 |
| 6,348,894 | B1 | * | 2/2002 | Lahti | 343/702 |
| 6,368,115 | B2 | * | 4/2002 | Kalis | 439/65 |

* cited by examiner

Primary Examiner—Tho Phan
(74) Attorney, Agent, or Firm—Aaron Waxler

(57) ABSTRACT

The electronic device of the invention is such constructed that the antenna part (3) and the RF circuit part (4) can show their respective functions even after the antenna part (3) and the RF circuit part (4) have been separated. Besides a scribe line 6 is formed on a—preferably ceramic—substrate for separating the antenna part (3) from the RF circuit part (4). Both parts may be separated after a change in any environmental condition, such as a change in the circuit configuration of the board on which the device (10) is to be mounted.

8 Claims, 3 Drawing Sheets

ELECTRONIC DEVICE AND A CIRCUIT ARRANGEMENT

The present invention relates to an electronic device comprising a first part and a second part which have different functions.

The invention also relates to a circuit arrangement provided with a board and with a first electronic device and a second electronic device having different functions, said first and second electronic devices being mounted on said board.

In recent years, since the demand for mobile communication equipments such as mobile telephones has grown, their size needs to be smaller. In order to meet this requirement, there is a tendency of introducing electronic devices that are able to fulfill multiple functions. An example of this is an electronic device wherein the functions of an antenna and an RF (Radio Frequency) circuit are provided. This kind of device will also be referred to as "an antenna-function-provided electronic device" hereinafter. This kind of device is provided with an antenna function, but the characteristic of the antenna may be easily influenced by environmental conditions. For example after changing the circuit configuration of the board on which it is mounted, the antenna characteristic will change as well. Thus, for each circuit configuration of the board a change in the design of the antenna-function-provided electronic device is necessary.

Accordingly there exists a problem that one kind of antenna-function-provided electronic device cannot cope with changes of the circuit configuration of the board. By the way, the board may be any board of insulating material, such as an alumina substrate, a printed circuit board (PCB), an multilayer ceramic board, a glass plate. It may further be a semi-insulating substrate such as a silicon wafer.

In view of the aforementioned problem, it is a first object of the invention to provide such electronic device that can easily cope with environmental changes such the change of the circuit configuration of the board.

It is a second object of the invention to provide circuit arrangements in which the device of the invention can be applied.

In order to achieve this object, the invention provides an electronic device adapted to be mounted on a board and comprising a first part and a second part which have different functions but are integrally formed, wherein said first part and said second part are arranged so as to be separable.

As aforementioned, when the circuit configuration of the board on which an antenna-function-provided electronic device is mounted, is changed, this results in a change of the antenna characteristic of the antenna-function provided electronic device. Therefore, the electronic device in accordance with the invention is adapted such that the first and the second parts are separable. In the case that the device of the invention does not display its desired characteristic, it may be separated into its first and its second part. The first and second parts can then display its respective desired characteristics, and both parts can be connected via a path. This path preferably includes a matching circuit. Thus, in accordance with the invention, even if the circuit configuration of the board is changed, it is not required to change the design of the electronic device of the invention. Instead the change can be coped with by means of separating the electronic device into the first part and the second part.

In an embodiment the electronic device is provided with a substrate that is separable along a boundary portion into a substrate of the first part and a substrate of the second part, and which substrate comprises—before separation—a through-hole at the boundary portion between said first and said second part, an electrode being present on an interior wall of said through-hole. It is an advantage of the device of this embodiment that an electrical connection between the separated first and second parts can be established easily through the electrode that is present on the interior wall of the through-hole.

In another embodiment the electronic device is provided with a substrate that is separable into a substrate of the first part and a substrate of the second part, which substrate is provided with:

a conductor being present across said first and said second part;

a first outer electrode provided in said first part;

a first connection electrode for connecting said conductor to said first outer electrode, said first connection electrode being present in said first part;

a second outer electrode provided in said second part; and a second connection electrode for connecting said conductor to said second outer electrode, said second connection electrode being present in said second part.

It is an advantage of the device of this embodiment that an electrical connection between the separated first and second parts can be established easily through the first and second outer electrodes.

In a further embodiment the substrate comprises a scribe line for separating said first part from said second part, said scribe line being formed at the boundary portion between said first part and said second part.

Preferably, the first part has the function of an antenna, and the second part has the function of signal processing. An RF Power Amplifier module is currently manufactured on a ceramic substrate, and it is foreseen that antennas will be manufactured on ceramic substrates. As the antenna is a very sensitive component, the invention is very suitable for reducing design costs for changing the design, as well as for reducing the manufacturing costs of antenna plus RF Power Amplifier Module. Although the use of a ceramic substrate is preferred, the invention can be embodied with any other substrate as well, such as a polymer substrate, a polymer multilayer substrate or any other multi-level substrate. The invention is especially suitable for a device for high frequencies, such as a device that may be used in accordance with the Bluetooth™-standard. With it the device can be miniaturized to a size of less than 120 mm$^2$.

The second object of the invention is realized in a circuit arrangement of the type mentioned in the opening paragraph, wherein:

said first electronic device comprises a first notch part formed by cutting away a part of said first electronic device and a first outer electrode formed on said first notch part, said second electronic device comprises a second notch part formed by cutting away a part of said second electronic device and a second outer electrode formed on said second notch part, and a path is present on said board, said path being for electrically connecting said first and second electronic devices via said first and second outer electrodes. It is further realized in a circuit arrangement of the type mentioned in the opening paragraph, wherein:

said first electronic device comprises a first conductor, a first outer electrode, and a first connecting electrode for connecting said first conductor and said first outer electrode, a part of said first conductor being exposed on a surface of said first electronic device, said second electronic device comprises a second conductor, a second outer electrode, and a second connecting electrode for connecting said second conductor and said second outer electrode, a part of said second conductor being exposed on a surface of said second electronic device, and a path is present on said board, said path being for electrically connecting said first and second electronic devices via said first and second outer electrodes. This second circuit arrangement preferably uses a multilayer substrate wherein the first and second conductor are embodied. Also further components may be embodied in this multilayer substrate.

In a further embodiment of this second circuit arrangement that surfaces of said electronic devices, on which parts of said conductors are exposed, are covered with a coating material. This embodiment has the advantage that the reliability of the characteristics of the first and second devices. Note that the first and second electronic devices have come into existence at the separation of the electronic device into its first part and its second part.

DETAILED DESCRIPTION OF THE INVENTION

Although some embodiments of this invention will be below described with reference to an electronic device to be used in mobile communication equipments such as mobile telephones, the invention is not intended to be limited to such mobile communication equipments.

Figure 1:
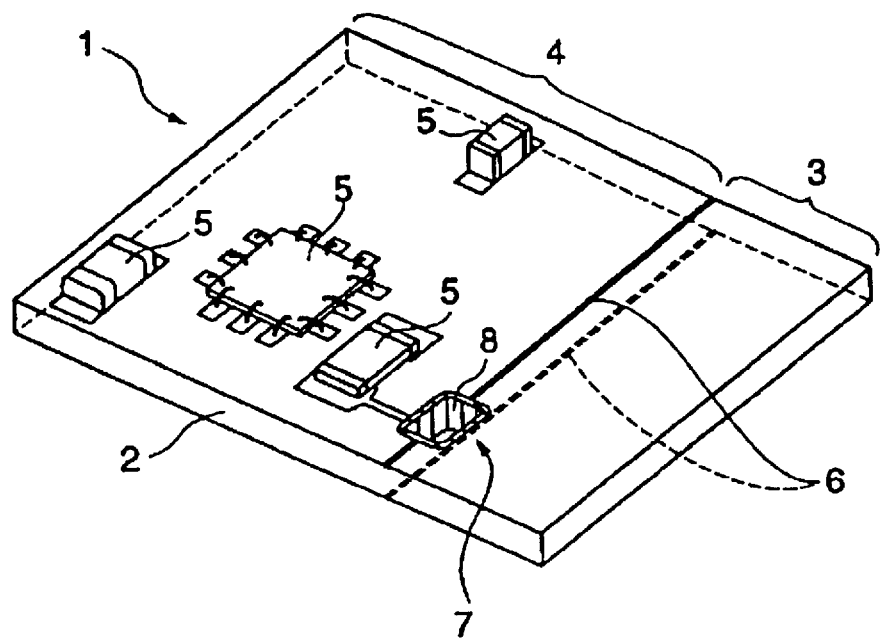
FIG. 1 is a perspective view of an electronic device in accordance with the first embodiment of the invention.

FIG. 1 is an perspective view of an electronic device in accordance with the first embodiment of the invention. This electronic device 1 comprises a ceramic substrate 2. The ceramic substrate 2 is provided with an antenna part 3 having a function of transmitting/receiving signals in a radio form and a RF circuit part 4 having a function of processing the signals received/transmitted through the antenna part 3. Several electronic devices 5 are mounted on the RF circuit part 4. Besides, in both upper and lower surfaces of the ceramic substrate 2, a scribe line 6 is formed along the boundary between the antenna part 3 and the RF circuit part 4 for separating the antenna part 3 from the RF part 4. Additionally, at a boundary portion between the antenna part 3 and the RF circuit part 4, there is provided a through hole 7 that penetrates through the ceramic substrate 2. An electrode 8 having a conductive material is formed on an interior wall of this through hole 7. The electrode 8 is electrically connected to both the antenna part 3 and the RF circuit part 4. The electronic device 1 constructed as mentioned above is integrally provided with the antenna part 3 and the RF circuit part 4.

When this electronic device 1 is mounted to a PCB for example, the characteristic of the antenna may be easily influenced by the circuit configuration of that PCB and may be variable depending on the PCB circuit configuration. Accordingly, if the electronic device 1 is designed to fit the characteristic of a specific PCB, the electronic device having been mounted on the specific PCB could display such characteristic as designed on condition that the type of the PCB is unchanged, but if the electronic device 1 is mounted on another type of PCB having a different circuit configuration in the same manner as in the case of the original design, the characteristic of the electronic device might deviate from the originally designed one. Further, in the case of mobile communication equipments such as mobile telephones, the PCB design is frequently changed due to model changes, so that the electronic device, in which the antenna part 3 and the RF circuit part 4 are integrally formed, may often become incapable to display the desired characteristic as originally designed. Thus, in order for the electronic device 1 to flexibly and less expensively cope with multiple types of the PCB or design changes of the PCB, the electronic device 1 in accordance with the invention is constructed as below described.

Specifically, the electronic device 1 is constructed such that each of the antenna part 3 and the RF circuit part 4 could perform its own function even if the antenna part 3 and the RF circuit part have been separated from each other. Additionally, as aforementioned, a scribe line 6 is formed on the ceramic substrate 2 for separating the antenna part 3 from the RF part 4. Thus, if the electronic device 1 cannot display the desired characteristic, the electronic device 1 is separated into the antenna part 3 and the RF circuit part 4 along the scribe line 6 and a matching circuit is provided between the separated antenna part 3 and the separated RF circuit part 4, so that the separated antenna part 3 and the separated RF circuit part 4 could display the respective characteristics as originally designed.

The following will explain how the separated antenna part 3 and the separated RF circuit part 4 are mounted on the PCB.

Figure 2:
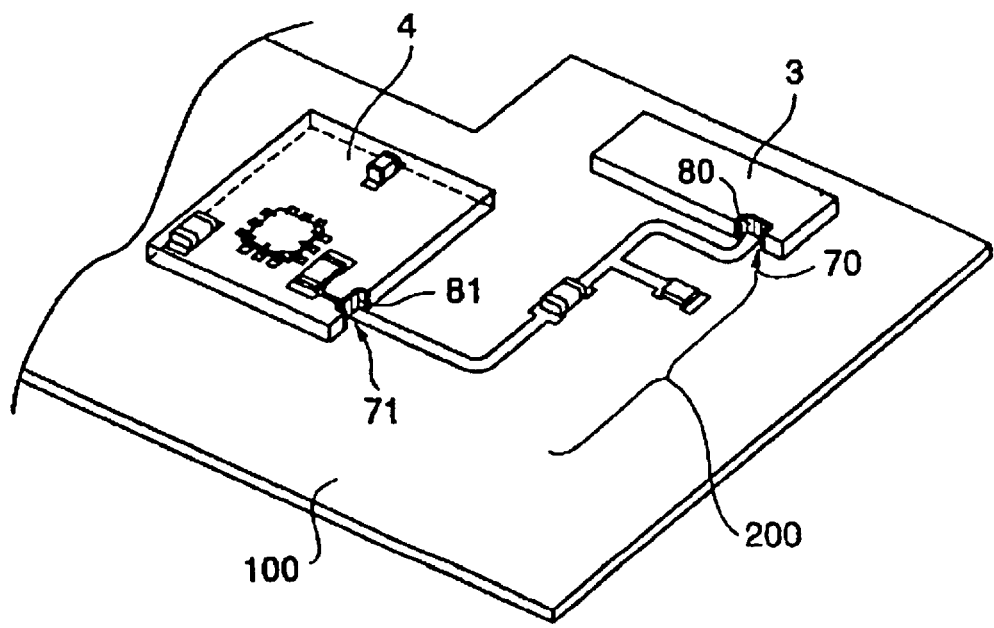
FIG. 2 illustrates a state after a separated antenna part 3 and a separated RF circuit part 4 have been mounted on a PCB 100.

FIG. 2 illustrates a status in which the separated antenna part 3 and the separated RF circuit part 4 have been mounted on the PCB 100. The scribe line 6 is formed on the ceramic substrate 2 via the through hole 7 (see FIG. 1). Therefore, when the antenna part 3 and the RF circuit part 4 are separated along the scribe line 6, the antenna part 3 is provided with a notch part 70 which is formed such that a part of the antenna part 3 is cut away and the RF circuit part 4 is provided with a notch part 71 which is formed such that a part of the RF circuit part 3 is cut away. Besides, the electrode 8 is formed on the interior wall of the through hole 7 (see FIG. 1). Therefore, when the antenna part 3 and the RF circuit part 4 are separated along the scribe line 6, the electrode 8 can be separated into two outer electrodes 80 and 81, the one electrode 80 being for the antenna part 3 and the other electrode 81 being for the RF circuit part 4. In order that the antenna part 3 can display the desired characteristic, a matching circuit 200 is disposed between the antenna part 3 and the RF circuit part 4. The matching circuit 200 electrically connects the antenna part 3 and the RF circuit part 4 through their respective outer electrodes 80 and 81. By virtue of such disposed matching circuit 200, the characteristic of the antenna part 3 could be adjusted, so that the antenna part 3 could display the desired characteristic. It should be noted that the matching circuit 200 may be constructed such that, for example, the circuit 200 comprises a capacitor for blocking the DC current flow or the circuit 200 comprises a strip line, and so on.

The electronic device 1 in accordance with the invention is designed allowing for the possibility of separation between the antenna part 3 and the RF circuit part 4. Therefore, there is no need to separate the electronic device 1 into the antenna part 3 and the RF circuit part 4 if the electronic device 1 can display its desired characteristic without the antenna part 3 and RF circuit part 4 separated, but, on the other hand, the electronic device 1 can be separated into the antenna part 3 and the RF circuit part 4 as illustrated in FIG. 2 only when the electronic device 1 can not display its desired characteristic without the antenna part 3 and RF circuit part 4 separated.

Besides, in the electronic device 1 in accordance with the invention, the electrode 8 is formed on the interior wall of the through hole 7. Accordingly, because the electrode 8 is beforehand formed in the electronic device 1, outer electrodes 80 and 81 could be formed by separating the electronic device 1 into the antenna part 3 and the RF circuit part 4, so that the electrical connection between the separated antenna part 3 and the separated RF circuit part 4 could easily be achieved by connecting the matching circuit 200 to the outer electrodes 80 and 81. However, the electronic device 1 may be not necessarily provided with the through hole 7 and the electrode 8. In such case, the antenna part 3 and the RF circuit part 4 are separated along the scribe line 6 and then an outer electrode is retrofitted to each of the separated antenna part 3 and the separated RF circuit part, so that the separated antenna part 3 and the separated RF circuit part 4 are connected to each other via the matching circuit 200.

The scribe line 6 is formed on the ceramic substrate 2. However, if the antenna part 3 and the RF circuit part 4 can be easily separated without the scribe line 6, the scribe line 6 is not necessarily required.

Figure 3:
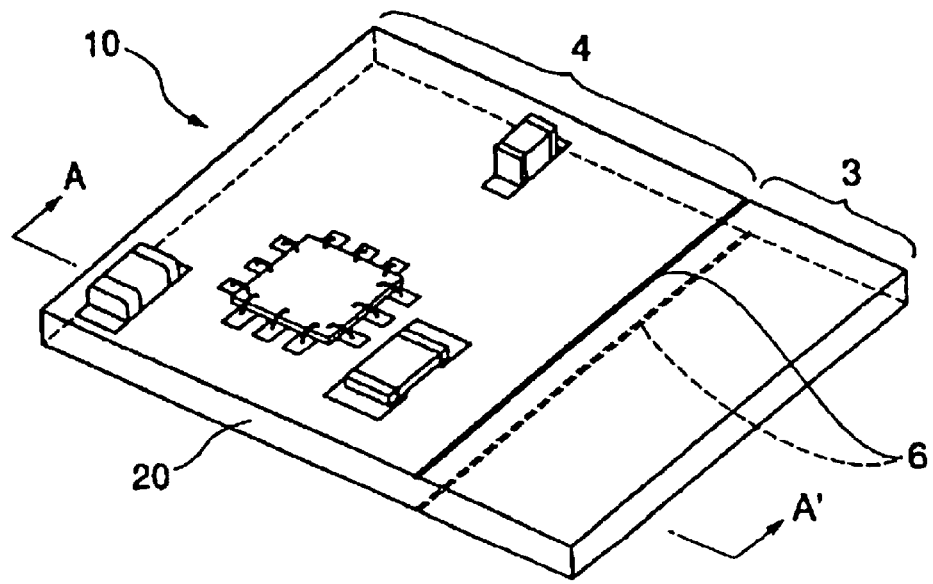
FIG. 3 is an perspective view of an electronic device in accordance with the second embodiment of the invention.

FIG. 3 is an perspective view of an electronic device in accordance with the second embodiment of the invention. The electronic device 10 comprises a ceramic substrate 20. The ceramic substrate 20 is provided with an antenna part 3 having a function of transmitting/receiving signals in a radio form and a RF circuit part 4 having a function of processing the signals received/transmitted via the antenna part 3. Besides, in both upper and lower surfaces of the ceramic substrate 2, a scribe line 6 is formed along the boundary between the antenna part 3 and the RF circuit part 4 for separating the antenna part 3 and the RF part 4.

It should be noted that in case of the electronic device 1 shown in FIG. 1, the through hole 7 is formed in the ceramic substrate 2 and the electrode 8 is formed on the interior wall of that through hole 7, but neither through hole 7 nor electrode 8 is formed in the ceramic substrate 20 of the electronic device 10 shown in FIG. 3. Instead, the electronic device 10 has a distinct structure different from the electronic device 1 shown in FIG. 1. The distinct structure will be explained as follows.

Figure 4:
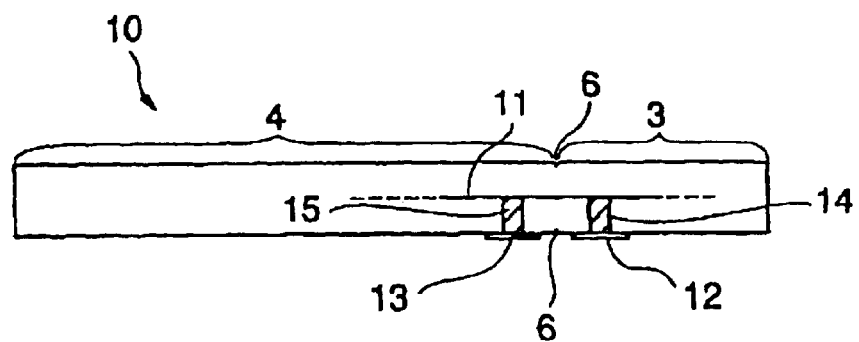
FIG. 4 is a cross-sectional view taken from the A–A' direction in FIG. 3.

FIG. 4 is a cross-sectional view taken along a A–A' direction in FIG. 3. Within the electronic device 10, an interior electrode 11 is formed so as to extend across both of the antenna part 3 and the RF circuit part 4. Besides, outer electrodes 12 and 13 are formed in the lower surfaces of the antenna part 3 and the RF circuit part 4 respectively. The outer electrodes 12 and 13 are electrically connected to the interior electrode 11 via respective connecting electrodes 14, 15.

Similarly to the electronic device 1 shown in FIG. 1, the electronic device 10 is structured such that, even if the antenna part 3 and the RF circuit part 4 have been separated, the separated antenna part 3 and the separated RF circuit part 4 could serve their own functions. Therefore, if the electronic device 10 can display its desired characteristic without the antenna part 3 and the RF circuit part 4 separated, the electronic device 10 itself is mounted on the PCB, but, on the other hand, if the electronic device 10 can not display its desired characteristic without the antenna part 3 and the RF circuit part 4 separated, the electronic device 10 is separated into the antenna part 3 and RF circuit part 4 and then a matching circuit is provided between the separated antenna part 3 with the separated RF circuit part 4.

Figure 5:
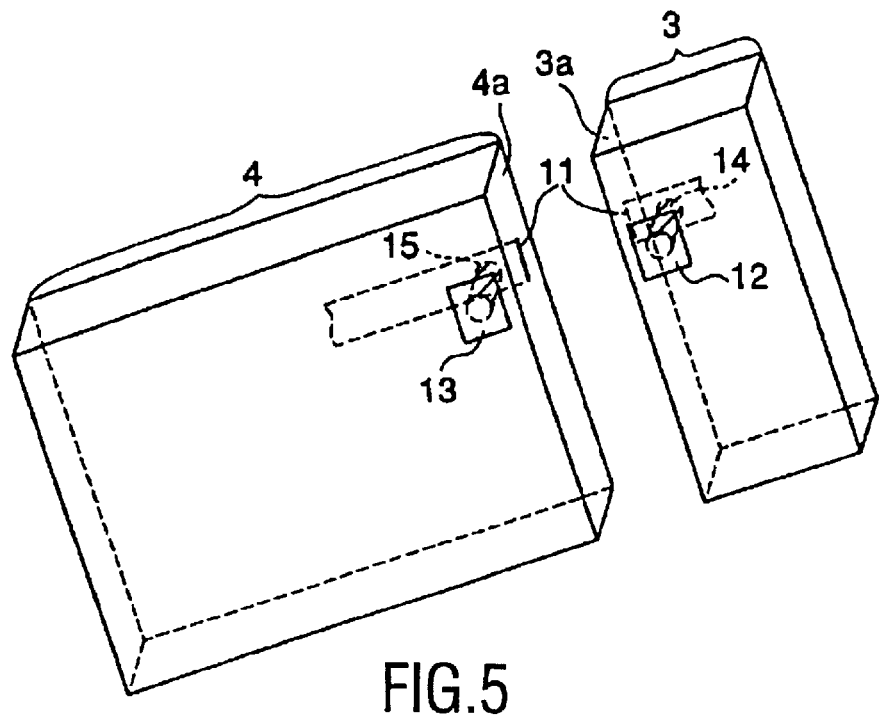
FIG. 5 is a perspective view of an electronic device 10, taken from underside, which has been separated into an antenna part 3 and a RF circuit part 4.

FIG. 5 is a perspective view of an electronic device 10, taken from underside, which has been separated into an antenna part 3 and a RF circuit part 4. In the ceramic substrate 20 of the electronic device 10 shown in FIG. 3, the interior electrode 11 is formed so as to extend across both of the antenna part 3 and the RF circuit part 4 (see FIG. 4). Therefore, when the antenna part 3 and the RF circuit part 4 are separated, the interior electrode 11 may be exposed on a side surface 3a of the antenna part 3 and a side surface 4a of the RF circuit part as illustrated in FIG. 5. It should be noted that appropriate ground electrodes are, in fact, formed in the lower surfaces of the antenna part 3 and the RF circuit part 4, but they are not shown herein.

The antenna part 3 and the RF circuit part 4 which have been thus separated will be mounted on the PCB.

Figure 6:
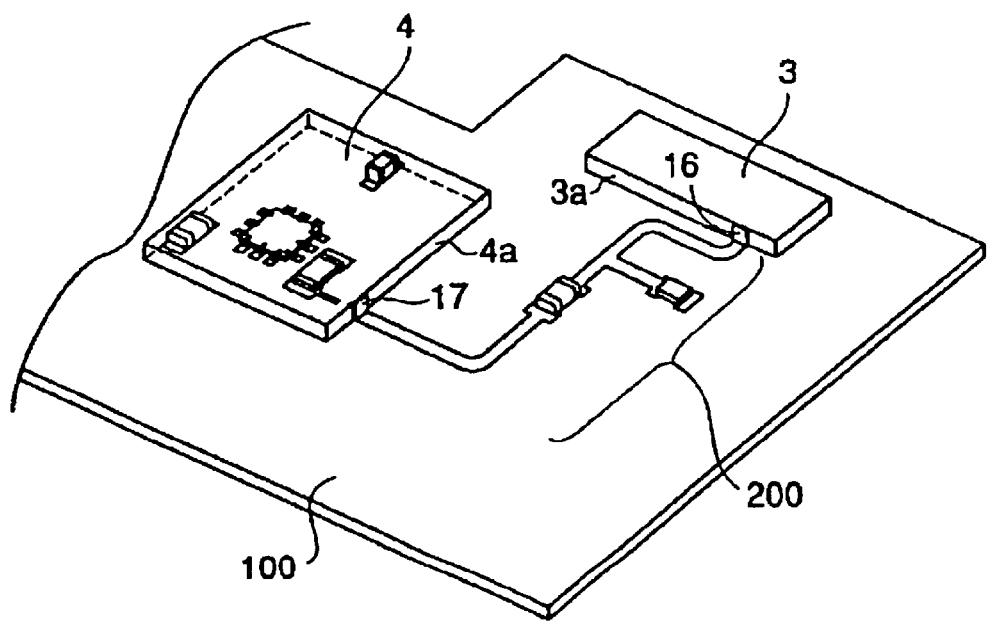
FIG. 6 illustrates a state where the separated antenna part 3 and RF circuit part 4 are mounted on a PCB.

FIG. 6 illustrates a state where said separated antenna part 3 and RF circuit part 4 are mounted on a PCB. Between the antenna part 3 and the RF circuit part 4, a matching circuit 200 is provided such that the antenna part 3 can display its desired characteristic. The matching circuit 200 electrically connects the antenna part 3 to the RF circuit part 4 via respective outer electrodes 12 and 13 (see FIG. 5). In accordance with such matching circuit 100, it is possible to adjust the characteristic of the antenna part 3 so as to display its desired characteristic.

Furthermore, on the side surface 3a of the antenna part 3 and the side surface 4a of the RF circuit part 4, coating members 16 and 17 are formed for covering the exposed portions of the interior electrode 11 (see FIG. 5). By virtue of such coating members 16 and 17, the interior electrode 11 can be prevented from being exposed to the air, so that the deterioration of the characteristics of the antenna part 3 and the RF circuit part 4 could be suppressed and accordingly their reliability could be improved. Of course, if the reliability of the antenna part 3 and the RF circuit part 4 can be sufficiently obtained without covering those exposed portions with the coating members 16 and 17, the coating members 16 and 17 are not necessarily required.

The aforementioned electronic devices 1 and 10 comprise an antenna part 3 having a function of transmitting/receiving signals in a radio form and a RF circuit part 4 having a function of processing the signals received/transmitted via the antenna part 3. However, the electronic devices in accordance with the invention may comprise, instead of the antenna part 3 and the RF circuit part 4, any part having any different function from the functions of these antenna and RF circuit parts 3 and 4.

Besides, The aforementioned electronic devices 1 and 10 comprise a structure having two functions of the antenna part 3 and the RF circuit part 4. However, the electronic devices in accordance with the invention may comprise such structure that contains three and more functions.

Thus, in accordance with the invention, an electronic device and a circuit device could be obtained that can easily cope with environmental changes such as circuit configuration changes in the PCB.

What is claimed is:

1. An electronic device (1) adapted to be mounted on a board (100) and comprising a first part (3) and a second part (4) which have different functions but are integrally formed, wherein said first part (3) and said second part (4) are arranged so as to be separable, wherein the device (1) is provided with a substrate (2) that is separable along a boundary portion into a substrate of the first part (3) and a substrate of the second part (4) and that comprises a through-hole (7) at the boundary portion between said first part (3) and said second part (4), an electrode (8) being present on an interior wall of said through-hole (7).

2. An electronic device (10) as claimed in claim 1, wherein said device (10) is provided with a substrate (20) that is separable into a substrate of the first part (3) and a substrate of the second part (4), said substrate (20) being provided with:

a conductor (11) being present across said first part (3) and said second part (4);

a first outer electrode (12) provided in said first part (3);

a first connection electrode (14) for connecting said conductor (11) to said first outer electrode (12), said first connection electrode (14) being present in said first part (3);

a second outer electrode (13) provided in said second part (4); and a second connection electrode (15) for connecting said conductor (11) to said second outer electrode (13), said second connection electrode (15) being present in said second part (4).

3. An electronic device (1,10) as claimed in claim 1, wherein said substrate (2,20) comprises a scribe line (6) for separating said first part (3) from said second part (4), said scribe line (6) being formed at the boundary portion between said first part (3) and said second part (4).

4. An electronic device (1,10) as claimed in claim 1, wherein said first part (3) has the function of an antenna for transmitting and/or receiving signals, and said second part (4) having a signal processing function of processing said signals transmitted and/or received by said first part (3).

5. A circuit arrangement provided with aboard (100) and with a first electronic device (3) and a second electronic device (4) having different functions, said first and second electronic devices (3,4) being mounted on said board (100), said first electronic device (3) comprising a first notch part (70) formed by cutting away a part of said first electronic device (3) and a first outer electrode (80) formed on said first notch part (70), said second electronic device (4) comprising a second notch part (71) formed by cutting away a part of said second electronic device (4) and a second outer electrode (81) formed on said second notch part (71), a path (200) being fanned on said board (100), said path (200) being for electrically connecting said first and second electronic devices (3,4) via said first and second outer electrodes (80,81).

6. A circuit arrangement as claimed in claim 5, characterized in that:

the first electronic device (3) comprises antenna means for transmitting and/or receiving signals;

the second electronic device (4) comprises signal processing means of processing said signals transmitted and/or received by said first electronic device (3), and the path (200) comprises an impedance matching circuit.

7. A circuit arrangement provided with a board (100) and with a first electronic device (3) and a second electronic device (4) having different functions, said first and second electronic devices (3,4) being mounted on said board (100), said first electronic device (3) comprising a first conductor (11), a first outer electrode (12), and a first connecting electrode (14) for connecting said first conductor (11) and said first outer electrode (12), apart of said first conductor (11) being exposed on a surface (3a) of said first electronic device (3), said second electronic device (4) comprising a second conductor (11), a second outer electrode (13), and a second connecting electrode (15) for connecting said second conductor (12) and said second outer electrode (13), a part of said second conductor (11) being exposed on a surface (4a) of said second electronic device (4), a path (200) being formed on said board (100), said path (200) being for electrically connecting said first and second electronic devices (3,4) via said first and second outer electrodes (12,13).

8. A circuit arrangement as claimed in claim 7, characterized in that surfaces (3a,4a) of said electronic devices (3,4), on which parts of said conductors (11) are exposed, are covered with a coating material.

* * * * *